(12) United States Patent
Kobayashi

(10) Patent No.: US 8,952,428 B2
(45) Date of Patent: Feb. 10, 2015

(54) ELEMENT ISOLATION STRUCTURE OF A SOLID-STATE PICKUP DEVICE

(75) Inventor: Masahiro Kobayashi, Tokyo (JP)

(73) Assignee: Canon Kabushiki Kaisha, Tokyo (JP)

(*) Notice: Subject to any disclaimer, the term of this patent is extended or adjusted under 35 U.S.C. 154(b) by 30 days.

(21) Appl. No.: 13/360,356

(22) Filed: Jan. 27, 2012

(65) Prior Publication Data
US 2012/0199883 A1 Aug. 9, 2012

(30) Foreign Application Priority Data

Feb. 9, 2011 (JP) ................................. 2011-026351

(51) Int. Cl.
*H01L 27/148* (2006.01)
*H01L 27/146* (2006.01)
(52) U.S. Cl.
CPC .... *H01L 27/14641* (2013.01); *H01L 27/14616* (2013.01); *H01L 27/14607* (2013.01); *H01L 27/1461* (2013.01)
USPC ........................................................ 257/225
(58) Field of Classification Search
USPC ............................................ 257/225; 438/87
See application file for complete search history.

(56) References Cited

U.S. PATENT DOCUMENTS

2008/0248607 A1* 10/2008 Nomura et al. ................. 438/75
2008/0283726 A1* 11/2008 Uya et al. ..................... 250/208.1

FOREIGN PATENT DOCUMENTS

| CN | 1905201 A | 1/2007 |
|---|---|---|
| CN | 101552280 A | 10/2009 |
| JP | 2006-229107 A | 8/2006 |
| JP | 2008-205044 A | 9/2008 |
| JP | 2009-016810 A | 1/2009 |
| JP | 2009-038309 A | 2/2009 |
| JP | 2010-206181 A | 9/2010 |

* cited by examiner

*Primary Examiner* — Kevin Parendo
(74) *Attorney, Agent, or Firm* — Canon USA, Inc. IP Division

(57) ABSTRACT

An N-type semiconductor region and a floating diffusion region are disposed in an active region. A transfer gate electrode for transferring charges from a PD to an FD is disposed on a semiconductor substrate through an insulator. A part of the N-type semiconductor region constituting the PD and a part of the transfer gate electrode are overlapped with each other. A P-type semiconductor region is disposed in the active region. The P-type semiconductor region and the portion overlapped with the transfer gate electrode of the N-type semiconductor region are disposed adjacent to each other in the direction parallel to the interface of the semiconductor substrate and the insulator. The position of the impurity concentration peak of the N-type semiconductor region and the position of the impurity concentration peak of the P-type semiconductor region are different from each other in depth.

16 Claims, 11 Drawing Sheets

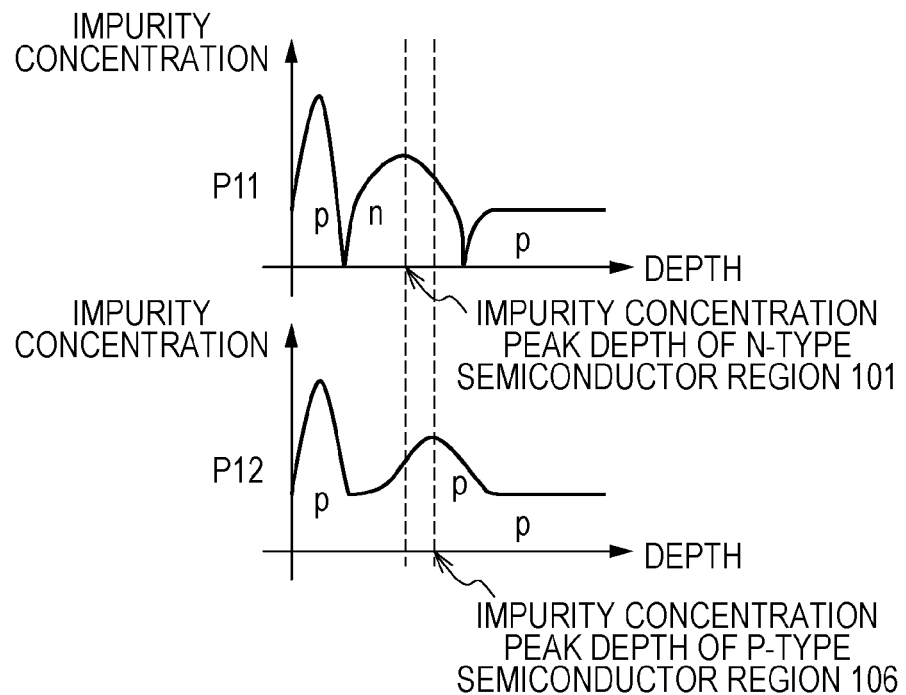
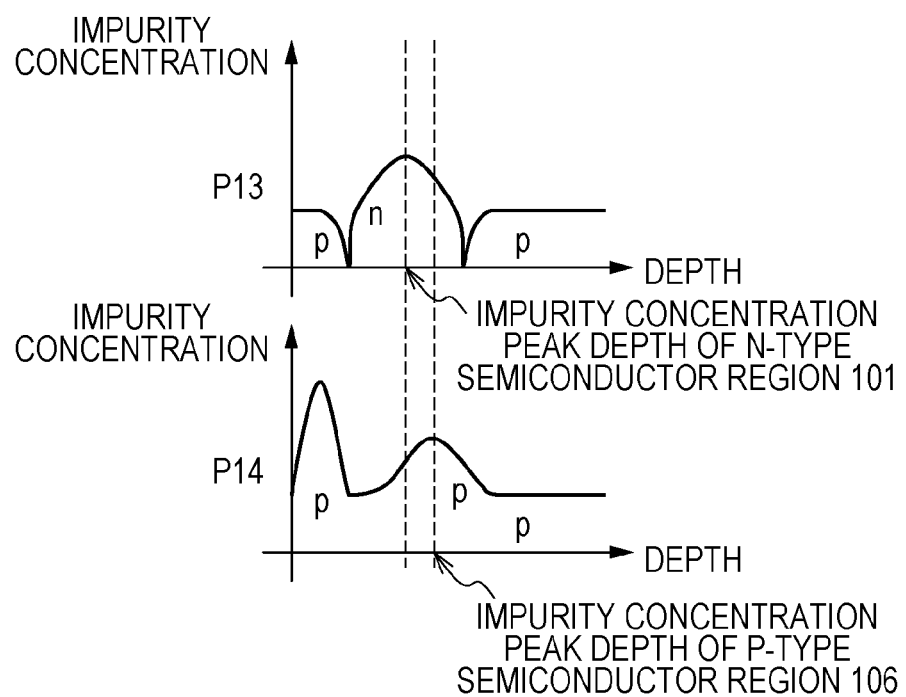

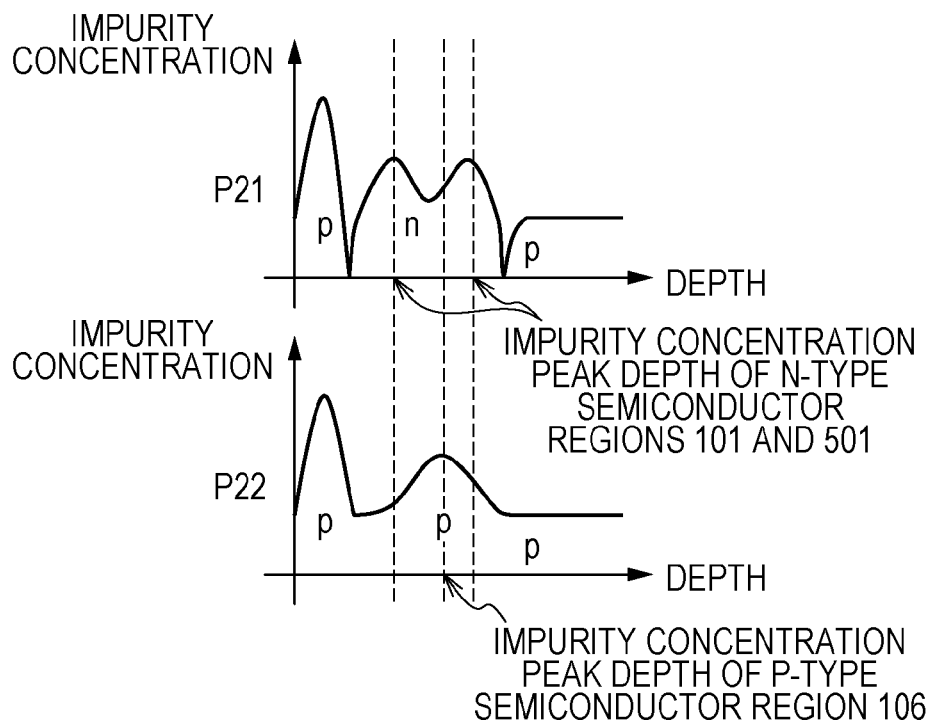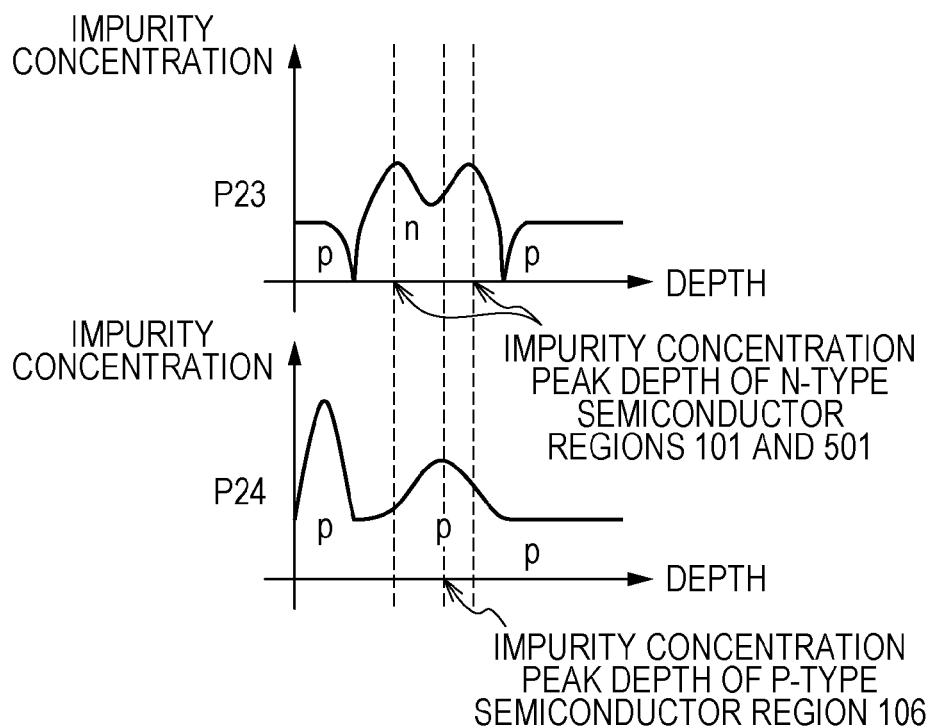

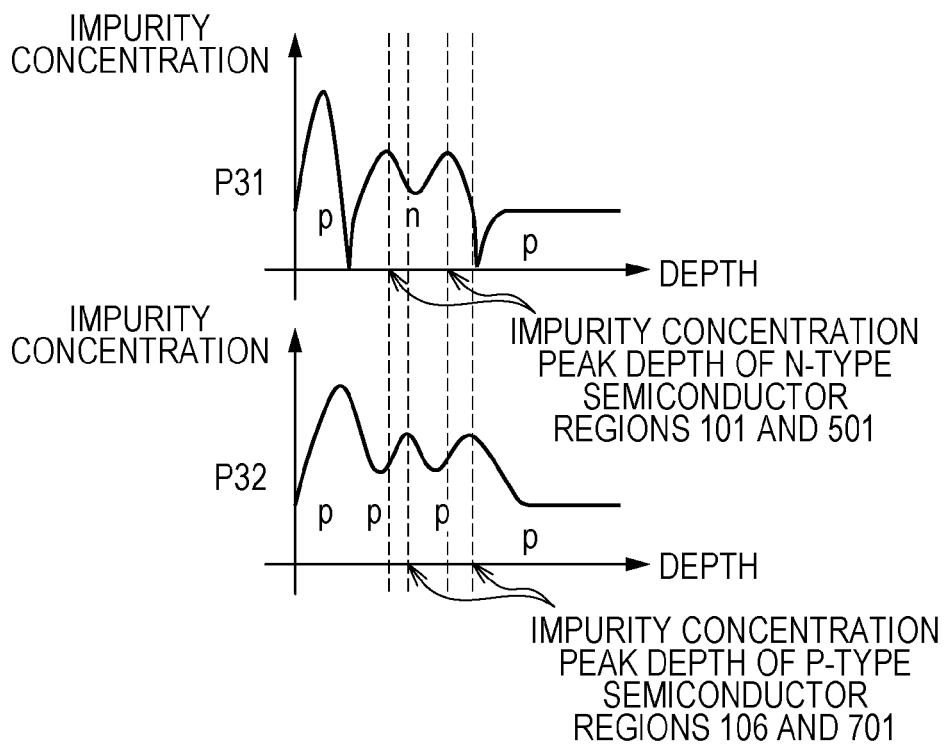
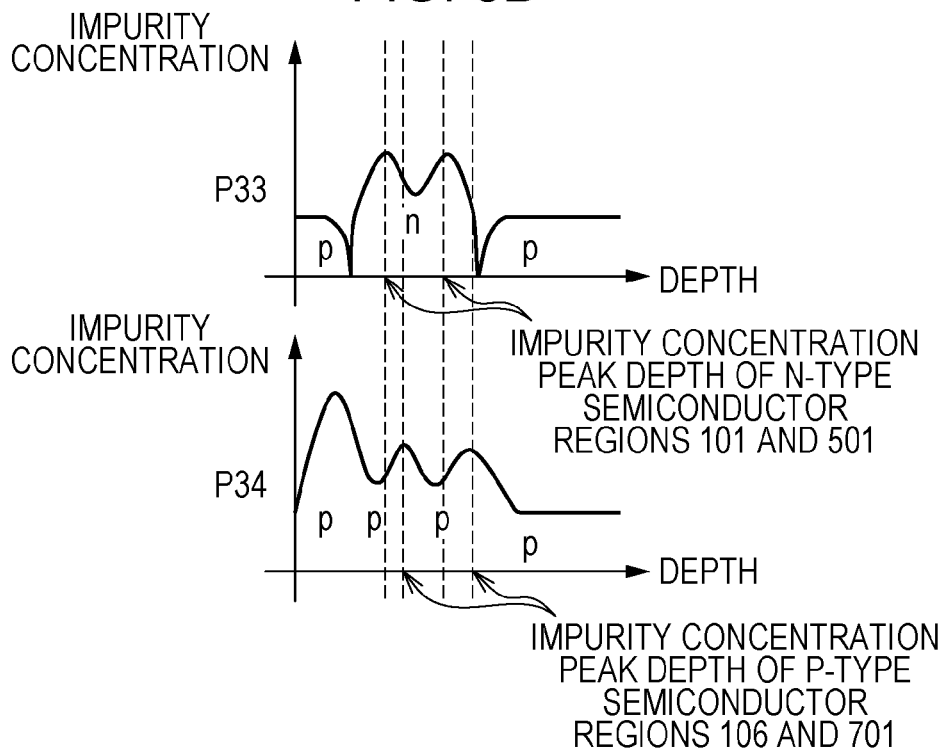

ELEMENT ISOLATION STRUCTURE OF A SOLID-STATE PICKUP DEVICE

BACKGROUND OF THE INVENTION

1. Field of the Invention

The present invention relates to a solid-state image pickup device, and particularly relates to an element isolation structure of a solid-state image pickup device.

2. Description of the Related Art

Japanese Patent Laid-Open No. 2009-016810 discloses an element isolation structure between a photoelectric conversion portion and a pixel transistor (active element). Specifically, the element isolation structure having the following characteristics is disclosed. First, an element isolation region is formed in a semiconductor region having a conductive type opposite to that of a source region and a drain region of a pixel transistor. Secondly, an insulation film disposed in a region from a channel region of the pixel transistor to the element isolation region is formed in a flat state having no level differences. According to Japanese Patent Laid-Open No. 2009-016810, the area occupied by the pixel transistor can be reduced by such an element isolation structure.

SUMMARY OF THE INVENTION

A solid-state image pickup device according to the present invention has a semiconductor substrate containing an active region, a first semiconductor region of a first conductive type, a second semiconductor region of a second conductive, a floating diffusion region, an insulator disposed on the semiconductor substrate, and a transfer gate electrode disposed on the semiconductor substrate through the insulator and configured to control transfer of charges from the first semiconductor region to the floating diffusion region, in which the first semiconductor region, the second semiconductor region, and the floating diffusion region are disposed in the active region, a part of the first semiconductor region is disposed to be overlapped with a part of the transfer gate electrode, the part of the first semiconductor region and the second semiconductor region are disposed adjacent to each other in the direction along the interface of the semiconductor substrate and the insulator, and the distance from the interface to the position of the impurity concentration peak of the part of the first semiconductor region is different from the distance from the interface to the position of the impurity concentration peak of the second semiconductor region.

Further features of the present invention will become apparent from the following description of exemplary embodiments with reference to the attached drawings.

BRIEF DESCRIPTION OF THE DRAWINGS

FIG. 4A is a view illustrating the impurity distribution of the solid-state image pickup device according to Example 1 of the invention.

FIG. 4B is a view illustrating the impurity distribution of the solid-state image pickup device according to Example 1 of the invention.

FIG. 6A is a view illustrating the impurity distribution of the solid-state image pickup device according to Example 2 of the invention.

FIG. 6B is a view illustrating the impurity distribution of the solid-state image pickup device according to Example 2 of the invention.

FIG. 8A is a view illustrating the impurity distribution of the solid-state image pickup device according to Example 3 of the invention.

FIG. 8B is a view illustrating the impurity distribution of the solid-state image pickup device according to Example 3 of the invention.

DESCRIPTION OF THE EMBODIMENTS

A solid-state image pickup device according to the invention has a semiconductor substrate 1. The semiconductor substrate 1 is a semiconductor material part among components constituting the solid-state image pickup device. The semiconductor substrate 1 refers to one in which a semiconductor region is formed on a semiconductor wafer by a known semiconductor manufacturing process, for example. As the semiconductor material, silicon is mentioned. An insulator 2 is disposed in contact with the semiconductor substrate 1 on the semiconductor substrate 1. The insulator 2 is a silicon oxide film, for example. The semiconductor substrate 1 has an active region. The active region is a region of the semiconductor substrate 1 where a semiconductor region constituting an element is disposed. The boundary of the active region is defined by an insulator isolation portion. More specifically, a region where the insulator isolation portion is not disposed can be referred to as the active region. The insulator isolation portion is also referred to as a field portion in some cases. Specifically, the boundary of the active region is defined by LOCOS (LOCal Oxidation of Silicon), STI (Shallow Trench Isolation), or the like. Or, the entire semiconductor substrate 1 may be the active region. In the insulator isolation portion, such as STI or LOCOS, the insulator is locally thick relatively to other part, or a trench is formed in the semiconductor substrate. A region which is not subjected to such processing (thickening the insulator, forming the trenches, or the like) can be referred to as the active region. From a different perspective, the interface of the semiconductor substrate 1 and the insulator 2 may be almost flat in the active region. The "almost flat" means the fact that the interface is not an ideal surface due to level differences caused by lamination defects, curvature in wafer level, and the like.

The plane in this description refers to a surface parallel to the interface of the semiconductor substrate 1 and the insulator 2 in the active region. The depth direction in this description is a direction perpendicular to the interface of the semiconductor substrate 1 and the insulator 2 in the active region.

Figure 1:
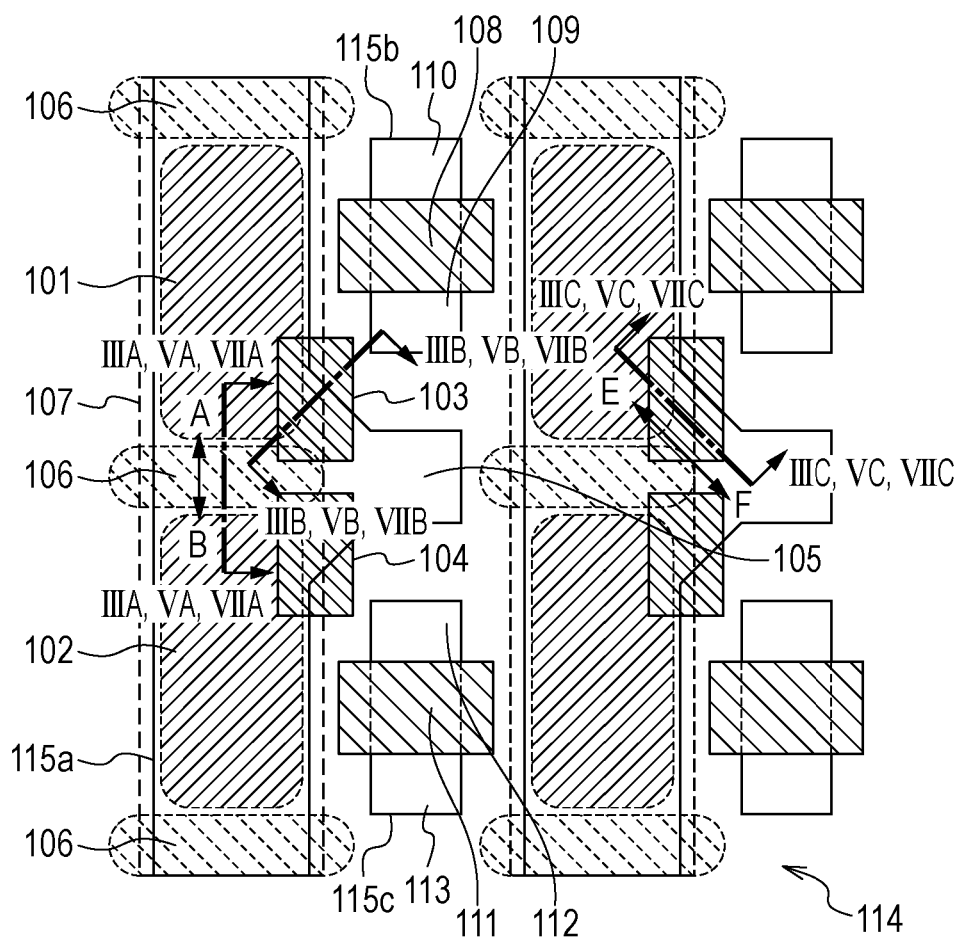
FIG. 1 is a schematic diagram of the planar structure of a solid-state image pickup device according to Example 1 of the invention.

Hereinafter, the principal portion of the invention is described with reference to FIG. 1. FIG. 1 illustrates a planar schematic diagram of a solid-state image pickup device. FIG. 1 illustrates a plurality of active regions 115*a*, 115*b*, and 115*c*. Specifically, the active region 115*a* where a photoelectric conversion portion and an FD are disposed and the active regions 115*b* and 115*c* where a source region and a drain region of a pixel transistor are disposed are illustrated. In the active region 115*a*, an N-type semiconductor region 101 is disposed. For example, the N-type semiconductor region 101 constitutes a part of the photoelectric conversion portion. As the photoelectric conversion portion, a photodiode (hereinafter, referred to as a PD) is mentioned. Electrons generated by photoelectric conversion are collected in the N-type semiconductor region 101. The N-type semiconductor region 101 may be a region capable of accumulating the electrons generated by photoelectric conversion. Moreover, a floating diffusion region (hereinafter referred to as an FD) 105 is disposed on the active region 115*a*. The FD 105 is constituted by the N-type semiconductor region. A transfer gate electrode 103 for transferring electrons from the N-type semiconductor region 101 to the FD 105 is disposed on the semiconductor substrate 1 through the insulator 2.

As illustrated in FIG. 1, a part of the N-type semiconductor region 101 constituting the PD and a part of the transfer gate electrode 103 are overlapped with each other. In other words, when the N-type semiconductor region 101 and the transfer gate electrode 103 are projected on one plane, the part of the N-type semiconductor region 101 and the part of the transfer gate electrodes 103 are projected on the same region on the plane.

On the active region 115*a*, P-type semiconductor regions 106 are disposed. The part of the N-type semiconductor region 101 overlapped with the transfer gate electrode 103 and the P-type semiconductor region 106 are disposed adjacent to each other in the plane direction. The plane direction is a direction along the interface of the semiconductor substrate 1 and the insulator 2. Thus, the P-type semiconductor region 106 can function as a potential barrier to the electrons of the N-type semiconductor region 101. Or, the P-type semiconductor regions 106 may have a function of electrically isolating the N-type semiconductor region 101 from another element. The other element refers to another N-type semiconductor region disposed on the active region 115*a*. For example, the P-type semiconductor region 106 may have a function as element isolation which electrically isolates the N-type semiconductor region 101 and an N-type semiconductor region 102 included in another photoelectric conversion portion. Or, the P-type semiconductor region 106 may have a function of electrically isolating the N-type semiconductor region 101 and a conductor buried in the active region 115*a*. Thus, it can be considered that when the P-type semiconductor regions 106 at least function as a potential barrier or element isolation to the N-type semiconductor region 101, the P-type semiconductor regions 106 are disposed adjacent to the N-type semiconductor region 101. Moreover, it may be considered that when the P-type semiconductor regions 106 constitute PN junction with the N-type semiconductor region 101, the P-type semiconductor regions 106 are disposed adjacent to the N-type semiconductor region 101.

The invention has a feature in that the depth from the interface of the semiconductor substrate 1 and the insulator 2 to the position of the impurity concentration peak of the N-type semiconductor region 101 is different from the depth from the interface of the semiconductor substrate 1 and the insulator 2 to the position of the impurity concentration peak of the P-type semiconductor region 106. FIGS. 4A and 4B illustrate the impurity distribution along the depth direction in the semiconductor substrate 1. The vertical axis represents the impurity concentration and the horizontal axis represents the depth. The plot of the impurity concentration along the depth direction forms a curve. The point at which the curve reaches the maximum point is the impurity concentration peak. Herein, the standard (starting point of the horizontal axis) of the depth is the interface of the semiconductor substrate 1 and the insulator 2 in the photoelectric conversion portion.

Subsequently, the effects obtained by the fact that the position of the impurity concentration peak of the N-type semiconductor region 101 and the position of the impurity concentration peak of the P-type semiconductor region 106 are different from each other in depth are described. First, an improvement of the charge transfer efficiency from the N-type semiconductor region 101 to the FD 105 by disposing a part of the N-type semiconductor region 101 in such a manner as to be overlapped with the transfer gate electrode 103 is described. Next, a possibility of a reduction in the effect that the transfer efficiency improves by disposing the P-type semiconductor region 106 in such a manner as to be adjacent to the part of the N-type semiconductor region 101 disposed to be overlapped with the transfer gate electrode 103 is described. Finally, the fact that the above-described matters are solved by the positional relationship in the depth direction of the impurity concentration peaks and the transfer efficiency improves which is a feature of the invention is described.

When charges are transferred from the N-type semiconductor region 101 to the FD 105, a predetermined voltage is supplied to the transfer gate electrode 103. As a result, a channel is formed directly under the transfer gate electrode 103. The predetermined voltage is a voltage used for forming the channel. The charges move to the FD 105 from the N-type semiconductor region 101 through the channel. In the invention, a part of the N-type semiconductor region 101 and a part of the transfer gate electrodes 103 are disposed to be overlapped with each other. More specifically, a part of the N-type semiconductor region 101 is disposed in a region directly under the transfer gate electrode 103 in which the channel is to be formed. This suppresses the generation of a potential barrier in the channel. As a result, the transfer efficiency improves.

In contrast, the P-type semiconductor region 106 is formed by the addition of P-type impurities (acceptors) to a predetermined region. However, depending on the accuracy of position control of a semiconductor process of adding the P-type impurities, there is a possibility that the P-type impurities may be added to regions other than the predetermined region.

Or, the P-type impurities may be diffused to regions other than the predetermined region in a process of heat treatment after ion implantation. Therefore, when the P-type semiconductor region 106 is disposed adjacent to the N-type semiconductor region 101, there is a possibility that the P-type impurities may be added also to the N-type semiconductor region 101. With such P-type impurities, the N-type impurities (donors) in the N-type semiconductor region 101 are compensated.

In particular, when the position of the impurity concentration peak of the N-type semiconductor region 101 and the impurity concentration peaks of the P-type semiconductor regions 106 are at the same depth, relatively high impurity concentration portions of the P-type semiconductor regions 106 are disposed near the N-type semiconductor region 106. Therefore, the N-type impurities of the N-type semiconductor region 101 are compensated with a large number of P-type impurities. As a result, there is a possibility that the impurity concentration of the N-type semiconductor region 101 may become sharply low. Or, a case where a region which is to be the N-type semiconductor region becomes an intrinsic semiconductor region or a P-type semiconductor region is also imagined. In this case, there is a possibility that the area of the N-type semiconductor region 101 may become sharply small.

Furthermore, the impurity concentration or the area of a relatively high impurity concentration region including a portion where the impurity concentration peak is disposed in the N-type semiconductor region 101 is likely to be small. The relatively high impurity concentration region of the N-type semiconductor region 101 dominantly contributes to the above-described effect of the improvement of the transfer efficiency. Therefore, when the impurity concentration or the area of such a region is small, the effect of the improvement of the transfer efficiency is also likely to be diminished.

Thus, when the impurity concentration of the part of the N-type semiconductor region 101 disposed to be overlapped with the transfer gate electrode 103 becomes low or when the area thereof becomes small, there is a possibility that transfer efficiency may decrease. This is because, first, the above-described effect of the improvement of the transfer efficiency decreases. Or, this is because, secondly, due to a reduction in the length in the channel width direction of the part of the N-type semiconductor region 101 disposed to be overlapped with the transfer gate electrode 103, the effective channel width becomes narrow.

When the impurity concentration or the area of the part of the N-type semiconductor region 101 which is not overlapped with the transfer gate electrode 103 becomes small, the sensitivity or the saturated charge amount may decrease, for example. However, since the area of the N-type semiconductor region 101 is sufficiently large, it can be considered that the influence is almost negligible. In contrast, the part of the N-type semiconductor region 101 disposed to be overlapped with the transfer gate electrode 103 has a small area. Therefore, even when the absolute amount in which the impurity concentration or the area decreases is the same, a relative ratio becomes large. Thus, the present inventors have found that a reduction in the transfer efficiency caused by the reduction in the impurity concentration or the area of the part of the N-type semiconductor region 101 disposed to be overlapped with the transfer gate electrode 103 is a matter to be solved.

In the invention, the position of the impurity concentration peak of the N-type semiconductor region 101 and the positions of the impurity concentration peaks of the P-type semiconductor regions 106 are different in depth. Therefore, the above-described matter can be solved.

According to the invention, the impurity concentration peak of the N-type semiconductor region 101 and the impurity concentration peaks of the P-type semiconductor regions 106 are disposed at different depths. Therefore, even when the N-type semiconductor region 101 and the P-type semiconductor regions 106 are disposed adjacent to each other as viewed in a plane, the high impurity concentration portions thereof are disposed at a predetermined distance in the depth direction. Thus, the number of the N-type impurities compensated by the P-type impurities of the P-type semiconductor regions 106 among the N-type impurities of the N-type semiconductor region 101 is reduced. Therefore, the impurity concentration or the area of the N-type semiconductor region 101 is hard to be small. As a result, the effect of the improvement of the transfer efficiency obtained by the fact that a part of the N-type semiconductor region 101 is disposed to be overlapped with a part of the transfer gate electrodes 103 becomes high.

The semiconductor regions having impurity concentration peaks can be formed by various methods. Ion implantation is mentioned as one method. When the semiconductor regions are formed by the ion implantation, the semiconductor regions have impurity concentration peaks at predetermined depths. Thereafter, heat treatment may be performed under the conditions such that the impurity concentration peak remains. Even in a case where the semiconductor regions are formed using the ion implantation, the semiconductor regions formed by ion implantation of energy in which the impurity concentration peak is positioned in the insulator 2 laminated on the semiconductor substrate 1 do not necessarily have impurity concentration peaks in the semiconductor region.

When the invention is applied to a configuration in which the area of the FD 105 as viewed in a plane is smaller than the area of the N-type semiconductor region 101 as viewed in a plane, the effect is higher. The reason is as follows. When the FD area is smaller than the PD area, the width of the channel is narrower than the width in the channel direction of the PD. In addition, a shorter channel length is beneficial in terms of transfer efficiency. Therefore, the channel area is smaller than the PD area in many cases. Therefore, the area of the part of the N-type semiconductor region 101 disposed to be overlapped with the transfer gate electrode 103 is very small compared with the area of the other portion of the N-type semiconductor region 101. Therefore, when the invention is applied to such a configuration, a higher effect is obtained.

Furthermore, due to the fact that the area of the FD 105 as viewed in a plane is smaller than the area of the N-type semiconductor region 101 as viewed in a plane, the effect of an improvement of sensitivity, an improvement of saturated charges, or an improvement of charge/voltage conversion efficiency is also obtained. This is because, first, the PD with a large area is more beneficial for increasing the sensitivity or the amount of saturated charges. This is because, secondly, the FD capacity is suitably small for increasing the charge/voltage conversion efficiency, and, to the end, the FD with a small area is more beneficial. Herein, the PD area as viewed in a plane refers to the area of a region where, when the PDs are projected onto one plane, the PDs are projected on the plane. The area of the FD 105 as viewed in a plane refers to the area of a region where, when the FDs 105 are projected onto one plane, the FDs 105 are projected onto the plane. Hereinafter, unless otherwise specified, the area as viewed in a plane is simply referred to as "area".

In the above description, the configuration in which electrons are used as signal charges is disclosed as an example. However, holes can be used as signal charges. When electrons are used as the signal charges, the first conductive type is an N-type and the second conductive type is a P-type. When holes are used as the signal charges, the conductive type of each semiconductor region may be reversed to the conductive type when the signal charges are electrons. More specifically, the first conductive type is a P-type and the second conductive type an N-type.

EXAMPLE 1

Examples of the invention are described in detail with reference to the drawings. FIG. 1 is a schematic plane view of a solid-state image pickup device of Example 1 according to the invention.

101 and 102 denote N-type semiconductor regions constituting photoelectric conversion portions. Each region constitutes PN junction PD with a P-type semiconductor region disposed at a deep position of a semiconductor substrate. The P-type semiconductor region is, for example, a P-type well or a P-type buried layer. Entering light is converted to charges in the photoelectric conversion portions. The charges generated by photoelectric conversion are accumulated in the N-type semiconductor regions 101 and 102.

103 and 104 denote transfer gate electrodes. 105 denotes an FD. The charges of the N-type semiconductor region 101 are transferred to the FD 105 by the transfer gate electrode 103. The charges of the N-type semiconductor region 102 are transferred to the FD 105 by the transfer gate electrode 104. The FD 105 functions as an input portion of an amplification portion described later. Specifically, the FD 105 converts the charges transferred to the FD 105 to a voltage in accordance with the amount of the charges. In this Example, the charges of the two N-type semiconductor regions 101 and 102 are transferred to the FD 105 which is a common node. However, it may be configured so that the FD is disposed as a different node to each photoelectric conversion portion in such a manner that the charges of the N-type semiconductor region 101 are transferred to a first FD and the charges of the N-type semiconductor region 102 are transferred to a second FD different from the first FD.

Between the N-type semiconductor region 101 and N-type semiconductor region 102, a P-type semiconductor region 106 is disposed. The P-type semiconductor region 106 electrically isolates the N-type semiconductor region 101 and the N-type semiconductor region 102.

A P-type semiconductor region 107 is a surface region for constituting the PDs as buried photodiodes. The P-type semiconductor region 107 is disposed at a shallower position of a semiconductor substrate relative to the N-type semiconductor regions 101 and 102. It is suitable that the P-type semiconductor region 107 is disposed to be overlapped with the entire surface of the N-type semiconductor region 101. It is a matter of course that it may be configured so that the P-type semiconductor region 107 is disposed to be overlapped only with a part of the N-type semiconductor region 101. Furthermore, the P-type semiconductor region 107 may be disposed to be overlapped with a part or the entire of the P-type semiconductor regions 106. The P-type semiconductor region 107 may be electrically connected to the P-type semiconductor regions 106.

108 denotes a gate electrode of a reset transistor. 109 and 110 denote a source region and a drain region, respectively, of the reset transistor. The source region 109 of the reset transistor and the FD 105 are electrically connected. 111 denotes a gate electrode of an amplification transistor. 112 and 113 denote a source region and a drain region, respectively, of the amplification transistor. The gate electrode 111 of the amplification transistor and the FD 105 are electrically connected.

114 denotes an insulator isolation portion. The insulator isolation portion 114 is an STI, for example. A region whose boundary is defined by the insulator isolation portion 114 is an active region. Specifically, in FIG. 1, the regions surrounded by the solid lines 115a to 115c are the active regions.

As illustrated in FIG. 1, a part of the N-type semiconductor region 101 is disposed to be overlapped with the transfer gate electrode 103. The P-type semiconductor region 106 is disposed in the active region 115a adjacent to the part of the N-type semiconductor region disposed to be overlapped with the transfer gate electrode 103.

A P-type semiconductor region is disposed in a region, where the N-type semiconductor region 101 and the P-type semiconductor region 106 are not disposed, of the portion overlapped with the transfer gate electrode 103 in the active region 115a. The P-type semiconductor region is a P-type well, for example. Or, the region may be subjected to channel doping to serve as a threshold value adjustment region for adjusting the threshold value of the transistor.

Figure 2:
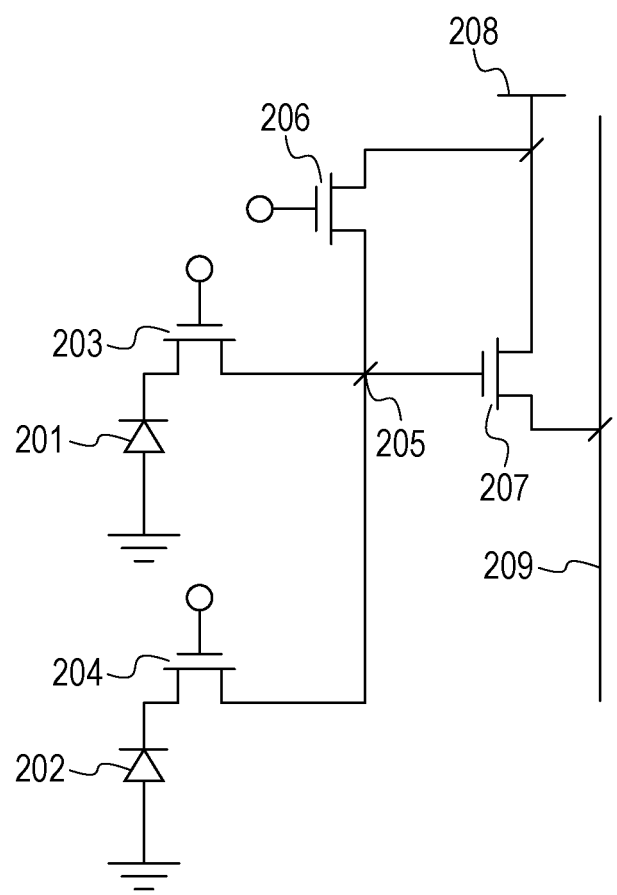
FIG. 2 is an equivalent circuit diagram of the solid-state image pickup device according to Example 1 of the invention.

FIG. 2 is an equivalent circuit diagram of a pixel in this Example. 201 denotes a first photoelectric conversion portion. 202 denotes a second photoelectric conversion portion. The first photoelectric conversion portion 201 is constituted including the N-type semiconductor region 101 of FIG. 1. The second photoelectric conversion portion 202 is constituted including the N-type semiconductor region 102 of FIG. 1.

203 denotes a first transfer transistor. 204 is a second transfer transistor. The gate of the first transfer transistor 203 is constituted including the transfer gate electrode 103 of FIG. 1. The N-type semiconductor region 101 of FIG. 1 corresponds to the source of the first transfer transistor 203. The FD 105 of FIG. 1 corresponds to the drain of the first transfer transistor 203. The transfer gate electrode 104, the N-type semiconductor region 102, and the FD 105 of FIG. 1 correspond to the gate, the source, and the drain of the second transfer transistor 204, respectively.

206 denotes a reset transistor. 207 denotes an amplification transistor. 205 denotes an input node of the amplification transistor 207. The FD 105 of FIG. 1 corresponds to the input node 205 of the amplification transistor 207. More specifically, in this Example, the FD 105 functions as an input portion of the amplification transistor.

208 denotes a power supply. The power supply 208 is electrically connected to the drain of the reset transistor 206 and the drain of the amplification transistor 207. The source of the amplification transistor 207 is connected to an output line 209.

By the above-described circuit configuration, a signal in accordance with light entering the photoelectric conversion portions is outputted to the output line 209. The operation is briefly described. First, when the reset transistor 206 turns ON, the input node 205 is reset to a power supply voltage. Subsequently, when the transfer transistor 203 turns ON, the charges accumulated in the first photoelectric conversion portion 201 are transferred to the input node 205. The charges transferred to the input node 205 are converted to a voltage. More specifically, the voltage of the input node 205 changes by a voltage in accordance with the amount of the transferred charges from the power supply voltage or a voltage when the FD is reset. The amplification transistor outputs a voltage in accordance with the voltage of the input node to the output line 209. ON and OFF of the first transfer transistor 203, the second transfer transistor 204, and the reset transistor 206 are controlled by a voltage supplied to each gate thereof.

Figure 3A:
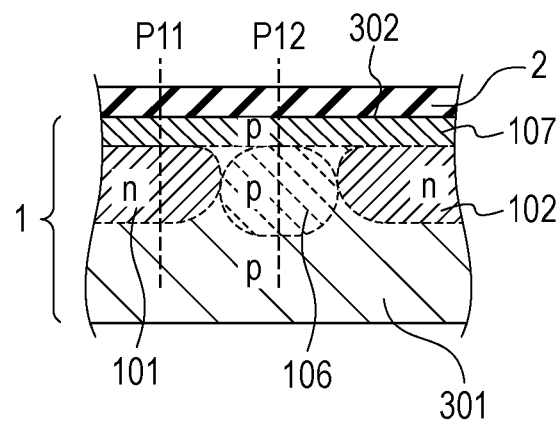
FIG. 3A is a schematic diagram of the cross-sectional structure of the solid-state image pickup device according to Example 1 of the invention.
Figure 3B:
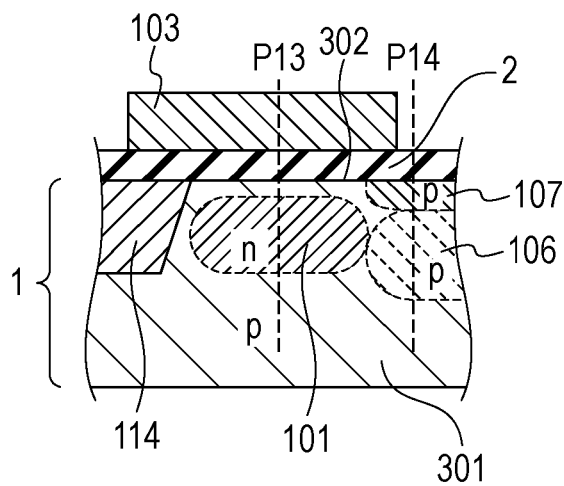
FIG. 3B is a schematic diagram of the cross-sectional structure of the solid-state image pickup device according to Example 1 of the invention.
Figure 3C:
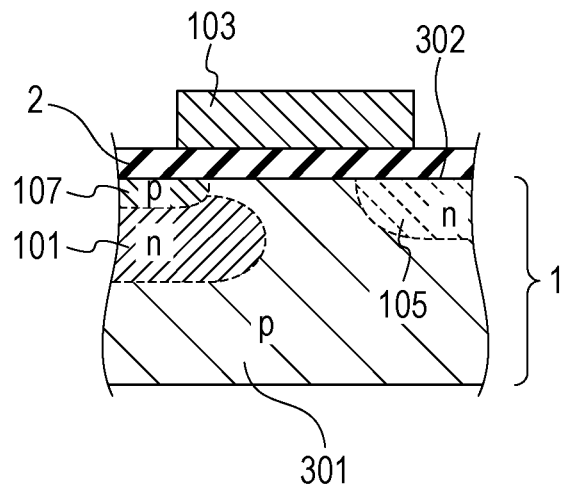
FIG. 3C is a schematic diagram of the cross-sectional structure of the solid-state image pickup device according to Example 1 of the invention.

Subsequently, the structure of the cross section of this Example and the impurity distribution along the depth direction are described. FIGS. 3A, 3B, and 3C represent the schematic diagrams of the cross sections along the IIIA-IIIA line, the IIIB-IIIB line, and the IIIC-IIIC line of FIG. 1, respectively. Portions corresponding to those of FIG. 1 are designated by the same reference numerals.

FIG. 4A illustrates the impurity distribution along the dashed line P11 and the dashed line P12 of FIG. 3A. FIG. 4B illustrates the impurity distribution along the dashed line P13 and the dashed line P14 of FIG. 3B. In FIGS. 4A and 4B, the vertical axis represents the impurity concentration and the horizontal axis represents the depth from the interface of the semiconductor substrate and the insulator 2.

FIG. 3A represents the cross section of the two photoelectric conversion portions. The P-type semiconductor region 106 is disposed in such a manner as to extend to a deeper position of the semiconductor substrate relative to the N-type semiconductor regions 102 and 103. Therefore, the N-type semiconductor regions 101 and 102 are electrically isolated by the element isolation portion 106 also at a deep position from the interface. The P-type semiconductor region 107 is disposed at a position shallower than the position of the N-type semiconductor regions 101 and 102 and the P-type semiconductor region 106. 302 denotes the interface of the semiconductor substrate 1 and the insulator 2. The insulator 2 is disposed on the semiconductor substrate 1 in such a manner as to contact the semiconductor substrate 1. Due to the fact that the P-type semiconductor region 107 is disposed in such a manner as to extend to a position overlapped with the element isolation layer 106, electrical isolation between the N-type semiconductor region 101 and N-type semiconductor region 102 can be more effectively performed.

301 denotes a P-type semiconductor region. The P-type semiconductor region 301 constitutes PN junction with the N-type semiconductor regions 101 and 102. The P-type semiconductor region 301 is a P-type well disposed on the N-type semiconductor substrate, for example. The P-type well may be constituted by a plurality of P-type semiconductor regions disposed at different depths. Or, the P-type semiconductor region 301 may be a P-type semiconductor substrate. More specifically, in a case where the photoelectric conversion portion is constituted by disposing the N-type semiconductor region at a predetermined position of the P-type semiconductor substrate, a region where the N-type semiconductor region is not disposed and the P-type semiconductor substrate remains as it is may be the P-type semiconductor region 301.

FIG. 4A represents the impurity distribution along the dashed line P11 and the dashed line P12 of FIG. 3A. The dashed line P11 represents the depth direction in the photoelectric conversion portion. The dashed line P12 represents the depth direction in the region where the P-type semiconductor region 106 is disposed. In the photoelectric conversion portion, the impurities contained in the P-type semiconductor region 107, the impurities contained in the N-type semiconductor region 102, and the impurities contained in the P-type semiconductor region 301 are disposed in this order from a shallower side. In the region where the P-type semiconductor region 106 is disposed, the impurities contained in the P-type semiconductor region 107, the impurities contained in the P-type semiconductor region 106, and the impurities contained in the P-type semiconductor region 301 are disposed in this order from a shallower side. Thus, in the drawings illustrating the impurity distribution, the impurity distribution of the N-type semiconductor regions is represented by "n" and the impurity distribution of P-type semiconductor regions is represented by "p". The same applies also in the following drawings.

As illustrated in FIG. 4A, the position of the impurity concentration peak of the N-type semiconductor region 101 is different in depth from the position of the impurity concentration peak of the P-type semiconductor region 106. In this Example, the position of the impurity concentration peak of the N-type semiconductor region 101 is located at a portion shallower than the position of the impurity concentration peak of the P-type semiconductor region 106.

Although not illustrated, the position of the impurity concentration peak of the N-type semiconductor region 102 is located at a depth different from the depth of the position of the impurity concentration peak of the P-type semiconductor region 106. In this Example, the position of the impurity concentration peak of the N-type semiconductor region 102 is located at a position shallower than the position of the impurity concentration peak of the P-type semiconductor region 106.

FIGS. 3B and 3C illustrate schematic diagrams of the cross section containing the transfer gate electrode 103. FIG. 3B illustrates a schematic diagram of the cross section perpendicular to the charge transfer direction from the N-type semiconductor region 101 to the FD 105. FIG. 3C illustrates a schematic diagram of the cross section including the charge transfer direction.

In FIGS. 3B and 3C, the transfer gate electrode 103 is disposed on the semiconductor substrate 1 through an insulator (not illustrated). As illustrated in FIGS. 3B and 3C, a part of the N-type semiconductor region 101 is disposed to be overlapped with the transfer gate electrode 103. As illustrated in FIG. 3B, the P-type semiconductor region 106 is disposed in a region adjacent to a part of the N-type semiconductor region 101 disposed to be overlapped with the transfer gate electrode 103. The insulator isolation portion 114 is disposed at the side opposite to the P-type semiconductor region 106. As illustrated in FIG. 3B, a part of the transfer gate electrode 103 may be overlapped with the P-type semiconductor region 106.

As illustrated in FIGS. 3B and 3C, the part of the N-type semiconductor region 101 disposed to be overlapped with the transfer gate electrode 103 is not overlapped with the P-type semiconductor region 107. In other words, the N type semiconductor region 101 extends to the vicinity of the FD 105 along the charge transfer direction relative to the P type semiconductor region 107. According to such a configuration, the charge transfer efficiency can be increased.

Such a configuration can be manufactured by the following methods. For example, the transfer gate electrode 103 is formed, first. Thereafter, the N-type semiconductor region 101 is formed by implanting impurities while giving inclination in the direction of getting under the transfer gate electrode 103, and then, conversely, the P-type semiconductor region 107 is formed by implanting impurities while giving inclination in the direction of moving away from the transfer gate electrode 107. According to another method, the N-type semiconductor region 101 is formed, first. Thereafter, the transfer gate electrode 103 is formed to be overlapped with the N-type semiconductor region 101. Thereafter, P-type semiconductor region 107 is formed using the transfer gate electrode 103 as a mask.

FIG. 4B illustrates the impurity distribution along the dashed line P13 and the dashed line P14 of FIG. 3B. The dashed line P13 illustrates the depth direction in the region where the N-type semiconductor region 101 and the transfer gate electrode 103 are overlapped. The dashed line P14 illustrates the depth direction in the P-type semiconductor region 106 disposed adjacent to the part of the N-type semiconductor region 101 disposed to be overlapped with the transfer gate electrode 103. In the region where the N-type semiconductor region 101 and the transfer gate electrode 103 are overlapped, the impurities contained in the N-type semiconductor region 101 and the impurities contained in P-type semiconductor region 301 are disposed in this order from a shallower side. In the region where the P-type semiconductor region 106 is disposed, the impurities contained in the P-type semiconductor region 107, the impurities contained in the P-type semiconductor region 106, and the impurities contained in the P-type semiconductor region 301 are disposed in this order from a shallower side.

As illustrated in FIG. 4B, the position of the impurity concentration peak of the part of the N-type semiconductor region 101 disposed to be overlapped with the transfer gate electrode 103 is different in depth from the position of the impurity concentration peak of the P-type semiconductor region 106. In this Example, the impurity concentration peak of a part of the N-type semiconductor region 101 is disposed at a position shallower than the position of the impurity concentration peak of the P-type semiconductor region 106.

Although not illustrated, the position of the impurity concentration peak of the part of the N-type semiconductor region 102 disposed to be overlapped with the transfer gate electrode 104 is different in depth from the position of the impurity concentration peak of the P-type semiconductor region 106. In this Example, the impurity concentration peak of the part of the N-type semiconductor region 102 is disposed at a position shallower than the position of the impurity concentration peak of the P-type semiconductor region 106.

When the position of the impurity concentration peak of the part of the N-type semiconductor region 102 and the position of the impurity concentration peak of the P-type semiconductor region 106 is slightly different from each other, the effects of the invention can be obtained. The depth from the interface 302 to the position of the impurity concentration peak of the part of the N-type semiconductor region 102 is different in depth by suitably 50 Å or more from the distance from the interface 302 to the position of the impurity concentration peak of the P-type semiconductor region 106. When the semiconductor region is formed by ion implantation, it is suitable that a difference in depth is larger than $\frac{1}{10}$ of the standard deviation of the penetration depth. The standard deviation is a distance from the average penetration depth of ions to the depth at which the impurity concentration reaches the half value of the impurity concentration at the average penetration depth. More specifically, the distance from the position of the impurity concentration peak to the position where the impurity concentration reaches the half value of the impurity concentration peak is the standard deviation.

In this Example, there is a case where the P-type semiconductor region having the impurity concentration peak with the same depth as that of the impurity concentration peak of the N-type semiconductor region 101 may be disposed adjacent to the N-type semiconductor region 101. For example, a case where the impurity concentration of the P-type semiconductor region is sufficiently low as compared with the impurity concentration of the N-type semiconductor region 101 or the P-type semiconductor region 106 is mentioned. For example, a case where the impurity concentration is $\frac{1}{10}$ or lower and the like are mentioned. When the impurity concentration is $\frac{1}{10}$ or lower, the influence on the impurity concentration of the N-type semiconductor region 101 or the P-type semiconductor region 106 is at most about 10%. Therefore, the influence may be negligible.

In considering the fact that incident light is subjected to photoelectric conversion in the substrate, when the P-type semiconductor region 107 is deeply formed, signal charges disappear due to re-combination to cause a reduction in sensitivity, and therefore it is suitable that the depth of the P-type semiconductor region 107 is shallow. Specifically, it is suitable that the position of the impurity concentration peak of the P-type semiconductor region 107 has a depth within 0.10 μm from the interface 302. The impurity concentration peak of the impurities implanted in order to form the P-type semiconductor region 107 may be located in the insulator laminated on the semiconductor substrate 1. In such a case, an impurity concentration peak does not exist in the P-type semiconductor region 107. When electrons are used as signal charges in order to reduce the segregation and the pileup of impurities at the interface 302, the P-type semiconductor region 107 is suitably formed with boron or a boron compound. When holes are used as signal charges, the conductive type is reversed. More specifically, the N-type semiconductor region 107 is suitably formed with arsenic or an arsenic compound.

When a part of the N-type semiconductor region 101 overlapped with the transfer gate electrode 103 is deeply disposed, there is a possibility that a voltage used for charge transfer may become high. Therefore, the position of the impurity concentration peak of a part of the N-type semiconductor region 101 disposed to be overlapped with the transfer gate electrode 103 is suitably deeper by 0.00 μm from the interface 302 and shallower by 0.30 μm from the interface 302. The depth from the interface 302 to the position of the impurity concentration peak of a part of the N-type semiconductor region 101 is more suitably in the range of 0.10 to 0.20 μm. In considering diffusion of the impurities, when electrons are used as signal charges, the N-type semiconductor region 101 is suitably formed with arsenic or an arsenic compound. When holes are used as signal charges, the conductive type is reversed. More specifically, the P-type semiconductor region 101 is suitably formed with boron or a boron compound.

The depth from the interface 302 to the position of the impurity concentration peak of the P-type semiconductor region 106 is suitably in the range of 0.20 to 0.30 μm. The depth from the interface 302 to the position of the impurity concentration peak of the P-type semiconductor region 106 is more suitably in the range of 0.22 to 0.25 μm. In considering diffusion of the impurities, when electrons are used as signal charges, the P-type semiconductor region 106 is suitably formed with boron or a boron compound. When holes are used as signal charges, the element isolation layer 106 is suitably formed with arsenic or an arsenic compound.

Thus, in this Example, the position of the impurity concentration peak of a part of the N-type semiconductor region 101 disposed to be overlapped with the transfer gate electrode 103 is shallower than the position of the impurity concentration peak of the P-type semiconductor region 106. According to such a configuration, electrical isolation can be performed while reducing a voltage used for charge transfer.

As described above, in this Example, the position of the impurity concentration peak of the N-type semiconductor region 101 and the position of the impurity concentration peak of the P-type semiconductor region 106 are different from each other in depth. According to such a configuration, a reduction in the impurity concentration in the portion overlapped with the transfer gate electrode 103 of the N-type semiconductor region 101 can be suppressed. As a result, the charge transfer efficiency from the photoelectric conversion portions to the FD 105 can be increased.

In this Example, the charges of the plurality of photoelectric conversion portion are transferred to a common FD. In this case, the charges are transferred in a direction (direction indicated by the EF line of FIG. 1) different from the direction (direction indicated by the AB line of FIG. 1) in which the plurality of photoelectric conversion portions are disposed. In such a configuration, the plurality of photoelectric conversion portions are closely disposed. In order to isolate the two photoelectric conversion portions that are closely disposed, the impurity concentration of the P-type semiconductor region 106 is suitably higher. In contrast, when the impurity concentration of the P-type semiconductor region 106 becomes high, the effective width of the transfer channel is narrowed due to the diffusion of the impurities. More specifically, the relationship between securing the electrical isolation performance and securing the width of the transfer channel establishes a trade off relationship. Therefore, the matter that the charge transfer efficiency decreases becomes more remarkable. Therefore, a more remarkable effect is obtained by applying the invention to the configuration such that charges of the plurality of photoelectric conversion portions are transferred to a common FD as in this Example.

EXAMPLE 2

Example 2 according to the invention is described. The planar structure, the equivalent circuit, and the operation of this Example are the same as those of Example 1. Example 2 is different from Example 1 in that the plurality of N-type semiconductor regions disposed at different depths are contained in one photoelectric conversion portion. This difference is described with reference to the drawings.

Figure 5A:
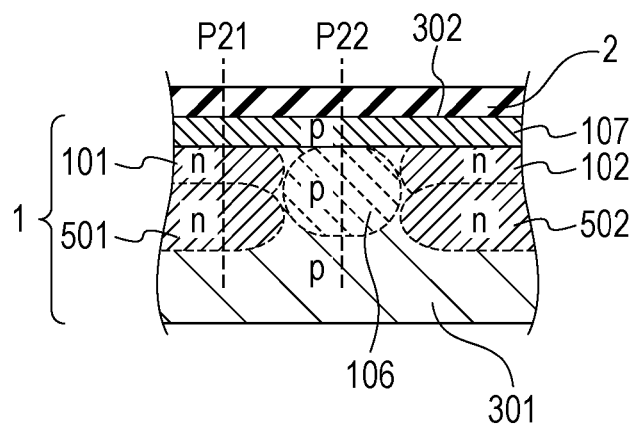
FIG. 5A is schematic diagram of the cross-sectional structure of a solid-state image pickup device according to Example 2 of the invention.
Figure 5B:
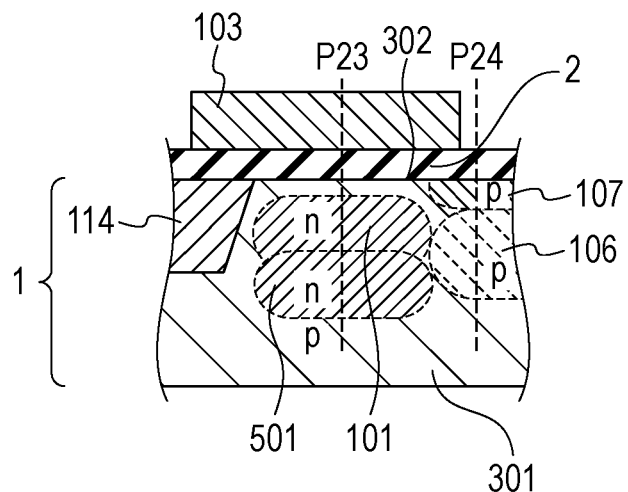
FIG. 5B is a schematic diagram of the cross-sectional structure of the solid-state image pickup device according to Example 2 of the invention.
Figure 5C:
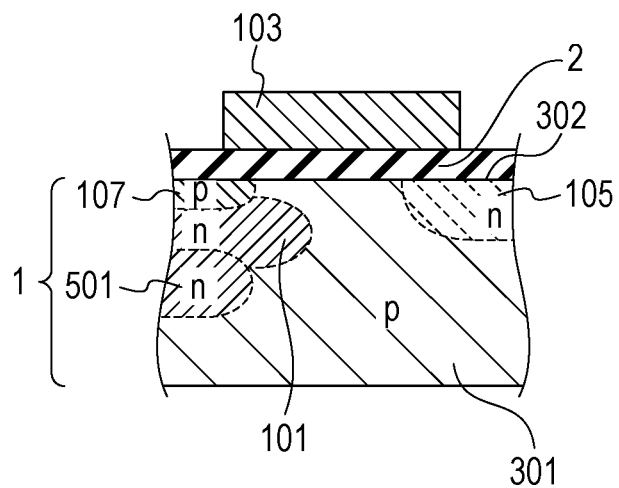
FIG. 5C is a schematic diagram of the cross-sectional structure of the solid-state image pickup device according to Example 2 of the invention.

The planar structure of this Example is illustrated in FIG. 1. FIGS. 5A, 5B, and 5C illustrate schematic diagrams of the cross sections along the VA-VA line, the VB-VB line, and the VC-VC line of FIG. 1, respectively. FIG. 6A illustrates the impurity distribution along the dashed line P21 and the dashed line P22 of FIG. 5A. FIG. 6B illustrates the impurity distribution along the dashed line P23 and the dashed line P24 of FIG. 5B. In FIGS. 6A and 6B, the vertical axis illustrates the impurity concentration and the horizontal axis illustrates the depth from the interface of the semiconductor substrate 1 and the insulator. Portions having the same function as in Example 1 are designated by the same reference numerals, and a detailed explanation thereof is omitted.

As illustrated in FIGS. 5A to 5C, in this Example, an N-type semiconductor region 501 is disposed at a deeper position from the interface 302 relative to the N-type semiconductor region 101. As viewed in a plane, the N-type semiconductor region 501 is partially or entirely overlapped with the N-type semiconductor region 101. The N-type semiconductor regions 101 and 501 are included in one photoelectric conversion portion (the first photoelectric conversion portion 201 of FIG. 2). As illustrated in FIG. 5A, an N-type semiconductor region 502 is disposed at a deeper position from the interface 302 relative to the N-type semiconductor region 102. As viewed in a plane, the N-type semiconductor region 502 is partially or entirely overlapped with the N-type semiconductor region 102. The N-type semiconductor regions 102 and 502 are included in one photoelectric conversion portion (the second photoelectric conversion portion 202 of FIG. 2).

FIG. 6A illustrates the impurity distribution along the depth direction (dashed line P21) in the photoelectric conversion portion. Since the N-type semiconductor region 101 and the N-type semiconductor region 501 disposed at different depths are overlapped with each other, two impurity concentration peaks corresponding to the two N-type semiconductor regions appear. More specifically, the peaks are the impurity concentration peak of the N-type semiconductor region 101 and the impurity concentration peak of the N-type semiconductor region 201. The position of the impurity concentration peak of the N-type semiconductor region 101 is shallower than the position of the impurity concentration peak of the N-type semiconductor region 501. FIG. 6A also illustrates the impurity distribution along the depth direction (dashed line P22) in the P-type semiconductor region 106. As illustrated in FIG. 6A, the position of the impurity concentration peak of the P-type semiconductor region 106 is different in depth from all of the positions of the impurity concentration peaks of N-type semiconductor regions 101 and 501.

FIG. 6B illustrates the impurity distribution along the depth direction (dashed line P23) in a part of the N-type semiconductor region 101 disposed to be overlapped with the transfer gate electrode 103. FIG. 6B also illustrates the impurity distribution along the depth direction (dashed line P24) in the P-type semiconductor region 106 disposed adjacent to a part of the N-type semiconductor region 101. As illustrated in FIG. 6B, the position of the impurity concentration peak of the P-type semiconductor region 106 is different in depth from all of the positions of the impurity concentration peaks of the N-type semiconductor regions 101 and 501. In this Example, the impurity concentration peak of the N-type semiconductor region 101, the impurity concentration peak of the P-type semiconductor region 106, and the impurity concentration peak of the N-type semiconductor region 501 are disposed in this order from the interface 302.

In this Example, the depth from the interface 302 to the position of the impurity concentration peak of the N-type semiconductor region 101 is suitably in the range of 0.10 to 0.20 µm. The depth from the interface 302 to the position of the impurity concentration peak of the P-type semiconductor region 106 is suitably in the range of 0.20 to 0.25 µm. The depth from the interface 302 to the position of the impurity concentration peak of the N-type semiconductor region 501 is suitably in the range of 0.25 to 0.35 µm. The depth from the interface 302 to the position of the impurity concentration peak of the P-type semiconductor region 107 is suitably in the range of 0.00 to 0.10 µm.

Thus, due to the fact that the plurality of N-type semiconductor regions having different depths are contained in one photoelectric conversion portion, the N-type semiconductor region can be disposed at a deeper position. This is because the plurality of N-type semiconductor regions having different depths can be easily formed by a plurality of times of ion implantation by different implantation energies. Due to the fact that the N-type semiconductor region is disposed at a deeper position, charges generated at a deep position of the semiconductor substrate 1 can be accumulated. As a result, the sensitivity can be increased.

As illustrated in FIG. 5C, in this Example, the N-type semiconductor region 101 extends to the FD 105 along the charge transfer direction relative to the N-type semiconductor region 501. Such a configuration is beneficial for a case where the transfer gate electrode 103 is formed, and then the N-type semiconductor regions 101 and 501 are formed. In the formation of the N-type semiconductor region 101 at a shallow side, a voltage used for charge transfer from the N-type semiconductor region 101 to the FD 105 can be lowered by implanting ions while giving inclination in the direction of getting under the transfer gate electrode 103. In this case, a shadowing effect obtained by photoresist or the transfer gate electrode 103 becomes large by increasing the inclination, and the amount of the impurities to be implanted decreases. As a result, the total amount of impurities in the N-type semiconductor region 101 decreases. In order to compensate the reduction in the impurities, the N-type semiconductor region 501 at a deeper side is formed by implanting ions while reducing the inclination as compared with the case where the N-type semiconductor region 101 is formed or in a vertical state. Thus, the shadowing effect is reduced, and the amount of the impurities in the photoelectric conversion portion can be increased. As a result, a voltage used for transferring charges can be kept at a low level without reducing the accumulated charge amount.

Furthermore, the N-type semiconductor region 101 may be formed by ion implantation of arsenic or an arsenic compound and N-type semiconductor region 501 may be formed by ion implantation of phosphorous or a phosphorus compound. Since phosphorous is lighter than arsenic, impurities can be implanted into a deeper position. In contrast, since arsenic is heavier than phosphorous, arsenic is beneficial in that arsenic is hard to diffuse. It is a matter of course that both the N-type semiconductor region 101 and the N-type semiconductor region 501 may be formed by ion implantation of arsenic or an arsenic compound.

EXAMPLE 3

Example 3 according to the invention is described. The planar structure, the equivalent circuit, and the operation of this Example are the same as those of Examples 1 and 2. Example 3 is different from Example 1 and Example 2 in that a plurality of P-type semiconductor regions having different depths are disposed adjacent to the N-type semiconductor region contained in the photoelectric conversion portion. This difference is described with reference to the drawings.

Figure 7A:
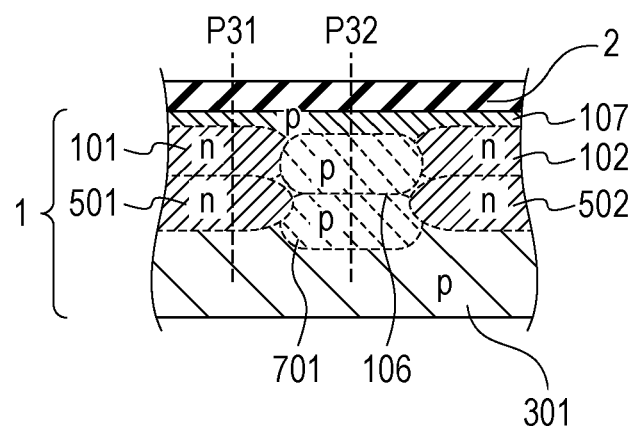
FIG. 7A is a schematic diagram of the cross-sectional structure of a solid-state image pickup device according to Example 3 of the invention.
Figure 7B:
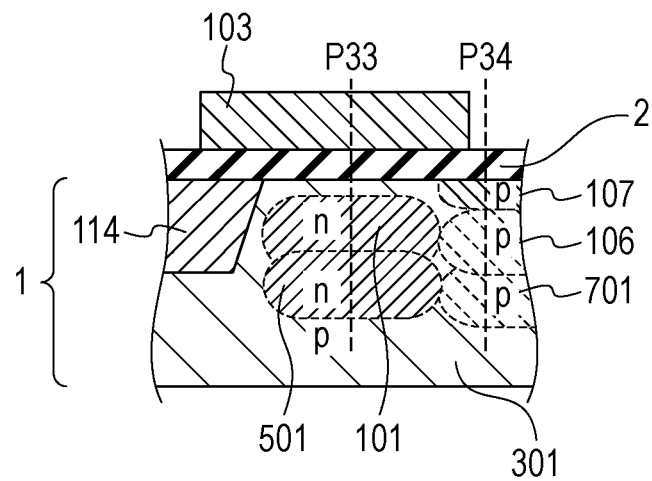
FIG. 7B is a schematic diagram of the cross-sectional structure of the solid-state image pickup device according to Example 3 of the invention.
Figure 7C:
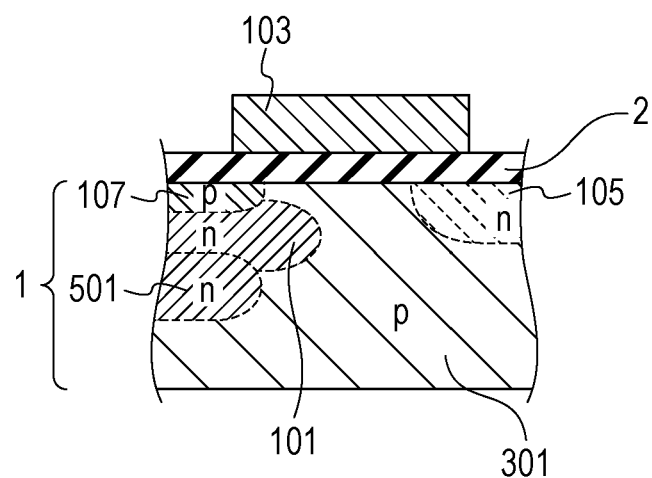
FIG. 7C is a schematic diagram of the cross-sectional structure of the solid-state image pickup device according to Example 3 of the invention.

The planar structure of this Example is illustrated in FIG. 1. FIGS. 7A and 7B illustrate schematic diagrams of the cross sections along the line VIIA-VIIA and the line VIIB-VIIB of FIG. 1, respectively. FIG. 8A illustrates the impurity distribution along the dashed line P31 and the dashed line P32 of FIG. 7A. FIG. 8B illustrates the impurity distribution along the dashed line P33 and the dashed line P34 of FIG. 7B. In FIGS. 8A and 8B, the vertical axis represents the impurity concentration and the horizontal axis represents the depth from the interface of the semiconductor substrate 1 and the insulator. Portions having the same function as in Example 1 or Example 2 are designated by the same reference numerals, and a detailed explanation thereof is omitted.

As illustrated in FIG. 7A, in this Example, the P-type semiconductor region 106 and a P-type semiconductor region 701 are disposed adjacent to the N-type semiconductor region 101. Both the P-type semiconductor region 106 and the P-type semiconductor region 701 are disposed in the active region 115. Moreover, as illustrated in FIG. 7B, the P-type semiconductor region 106 and the P-type semiconductor region 701 are disposed adjacent to a part of the N-type semiconductor region 101 disposed to be overlapped with the transfer gate electrode 103. The P-type semiconductor region 701 is disposed at a deeper position from the interface 302 relative to the P-type semiconductor region 106. As viewed in a plane, the P-type semiconductor region 701 is partially or entirely overlapped with the P-type semiconductor region 106. The P-type semiconductor region 701 electrically isolates the N-type semiconductor region 101 from other elements. In FIG. 7A, the P-type semiconductor region 701 electrically isolates the N-type semiconductor region 101 and the N-type semiconductor region 102. Thus, in this Example, in order to electrically isolate the N-type semiconductor region 101 contained in the photoelectric conversion portion from other elements, the plurality of P-type semiconductor regions having different depths are disposed adjacent to the N-type semiconductor region 101.

In FIG. 8A, the impurity distribution along the depth direction (dashed line P31) in the photoelectric conversion portion is the same as that of Example 2. The impurity distribution along the depth direction (dashed line P32) in the P-type semiconductor region 106 has the impurity concentration peak of the P-type semiconductor region 106 and the impurity concentration peak of the P-type semiconductor region 701. The position of the impurity concentration peak of the P-type semiconductor region 106 and the position of the impurity concentration peak of the P-type semiconductor region 701 are different in depth from the position of the impurity concentration peak of the N-type semiconductor region 101.

In FIG. 8B, the impurity distribution along the depth direction (dashed line P33) in a part of the N-type semiconductor region 101 disposed to be overlapped with the transfer gate electrode 103 is the same as that of Example 2. The impurity distribution along the depth direction (dashed line P32) in the P-type semiconductor region 106 has the impurity concentration peak of the P-type semiconductor region 106 and the impurity concentration peak of the P-type semiconductor region 701. The position of the impurity concentration peak of the P-type semiconductor region 106 and the position of the impurity concentration peak of the P-type semiconductor region 701 are different in depth from the position of the impurity concentration peak of the N-type semiconductor region 101. In this Example, the impurity concentration peak of the N-type semiconductor region 101, the impurity concentration peak of the P-type semiconductor region 106, the impurity concentration peak of N-type semiconductor region 501, and the impurity concentration peak of the P-type semiconductor region 701 are disposed in this order from a shallower side. The depths of the impurity concentration peaks of these four semiconductor regions are different from each other.

In this Example, the depth from the interface 302 to the position of the impurity concentration peak of the N-type semiconductor region 101 is suitably in the range of 0.10 to 0.20 µm. The depth from the interface 302 to the position of the impurity concentration peak of the P-type semiconductor region 106 is suitably in the range of 0.20 to 0.25 µm. The depth from the interface 302 to the position of the impurity concentration peak of the N-type semiconductor region 501 is suitably in the range of 0.25 to 0.35 µm. The depth from the interface 302 to the position of the impurity concentration peak of the P-type semiconductor region 701 is suitably in the range of 0.35 to 0.50 µm. The depth from the interface 302 to the position of the impurity concentration peak of the P-type semiconductor region 107 is suitably in the range of 0.00 to 0.10 µm.

As described above, in this Example, the P-type semiconductor region 106 and the P-type semiconductor region 701 are disposed adjacent to the N-type semiconductor region 101. Both the position of the impurity concentration peak of the P-type semiconductor region 106 and the position of the impurity concentration peak of the P-type semiconductor region 701 are different in depth from the position of the impurity concentration peak of the N-type semiconductor region 101. According to such a configuration, there is a benefit in that disposing a P-type semiconductor region at a deeper position is facilitated in addition to the effects of Example 2.

Moreover, in this Example, the impurity concentration peak of the P-type semiconductor region 701 may be disposed at a position shallower than the position of the impurity concentration peak of the N-type semiconductor region 101. It may be configured so that the impurity concentration peak of the P-type semiconductor region 106, the impurity concentration peak of the N-type semiconductor region 101, the impurity concentration peak of the P-type semiconductor region 701, and the impurity concentration peak of N-type semiconductor region 501 are disposed in this order from a shallower side. According to such a configuration, the electrical isolation performance can be improved. When a voltage is applied to the transfer gate electrode 103 or another gate electrode, the potential of a region near the interface 302 sharply changes by the electric field effect. This is because the electrical isolation performance can be improved due to the fact that the P-type semiconductor region 106 having an electrical isolation function is disposed in a region near the interface.

EXAMPLE 4

Figure 9:
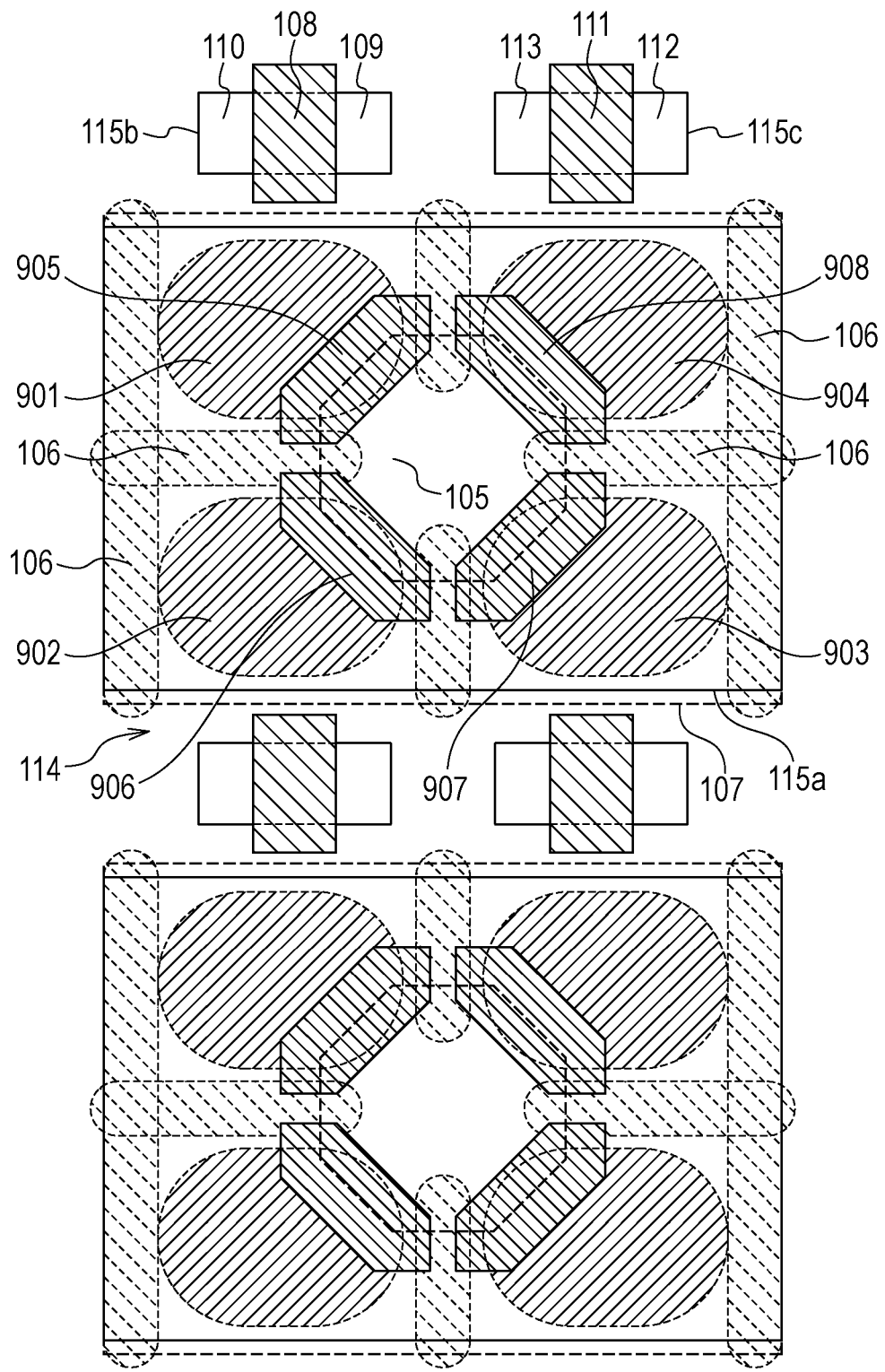
FIG. 9 is a schematic diagram of the planar structure of a solid-state image pickup device according to Example 4 of the invention.

Example 4 according to the invention is described. FIG. 9 is a schematic diagram of the planar structure of this Example. Portions having the same function as in Examples 1 to 3 are designated by the same reference numerals, and a detailed explanation thereof is omitted.

This Example has a feature in that charges of four photoelectric conversion portions are transferred to the common FD 105. In FIG. 9, 901 denotes an N-type semiconductor region contained in a first photoelectric conversion portion. 902 denotes an N-type semiconductor region contained in a second photoelectric conversion portion. 903 denotes an N-type semiconductor region contained in a third photoelectric conversion portion. 904 denotes an N-type semiconductor region contained in a fourth photoelectric conversion portion.

The four N-type semiconductor regions 901 to 904 accumulate the charges generated in the first to fourth photoelectric conversion portions, respectively. Transfer gate electrodes 905 to 908 are disposed corresponding to the four N-type semiconductor regions 901 to 904, respectively. By the transfer gate electrodes 905 to 908, the charges accumulated in the four N-type semiconductor regions 901 to 904 are transferred to the common the FD 105.

In this Example, a part of the N-type semiconductor region 901 is disposed to be overlapped with the corresponding transfer gate electrode 905. Similarly, a part of each of the N-type semiconductor regions 902 to 904 is disposed to be overlapped with each of the corresponding transfer gate electrodes 906 to 908, respectively. The P-type semiconductor regions 106 are disposed in the active regions 115 adjacent to parts disposed to be overlapped with the transfer gate electrodes.

The impurity distribution along the depth direction in the region where the N-type semiconductor regions 901 to 904 are disposed is the same as the impurity distribution in the region where the N-type semiconductor region 101 is disposed of Examples 1 to 3. Therefore, the position of the impurity concentration peak of each of the N-type semiconductor regions 901 to 904 is different in depth from the position of the impurity concentration peak of the P-type semiconductor region 106.

Figure 10:
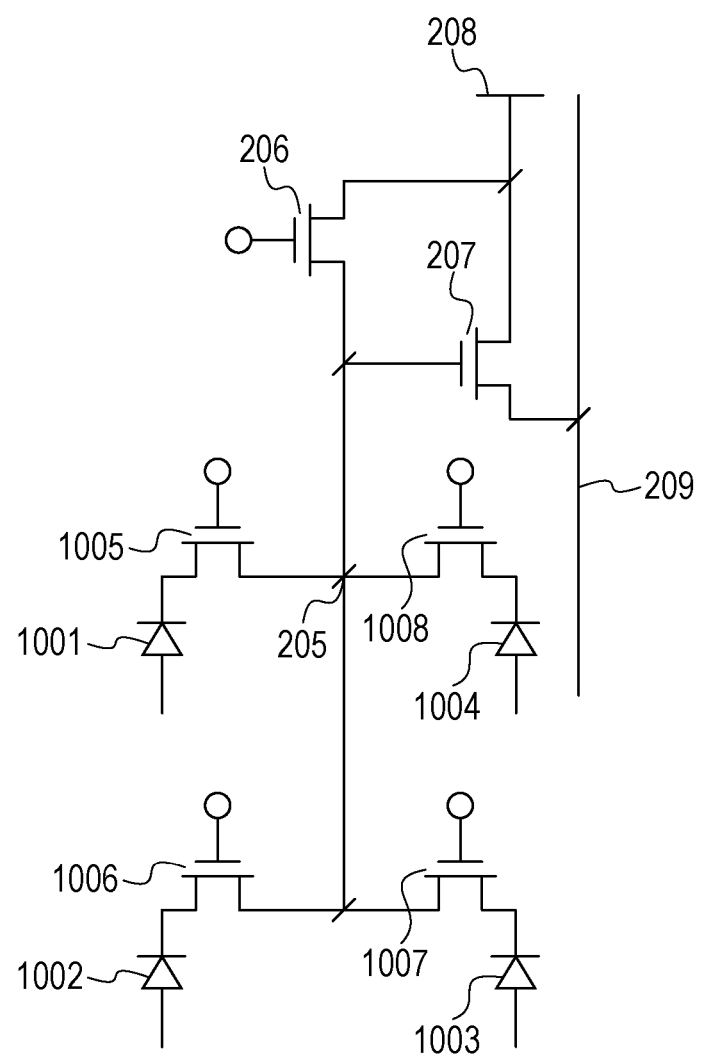
FIG. 10 is an equivalent circuit diagram of the solid-state image pickup device according to Example 4 of the invention.

FIG. 10 illustrates the equivalent circuit of this Example. 1001 denotes a first photoelectric conversion portion, 1002 denotes a second photoelectric conversion portion, 1003 denotes a third photoelectric conversion portion, and 1004 denotes a fourth photoelectric conversion portion. 1005 denotes a first transfer transistor, 1006 denotes a second transfer transistor, 1007 denotes a third transfer transistor, and 1008 denote a fourth transfer transistor. ON and OFF of the first to fourth transfer transistors are mutually and independently controlled.

As illustrated in FIG. 10, the four photoelectric conversion portions share one amplification transistor 207 in this Example. According to such a configuration, the area of the photoelectric conversion portions can be enlarged in addition to the effects of Examples 1 to 3.

EXAMPLE 5

Figure 11:
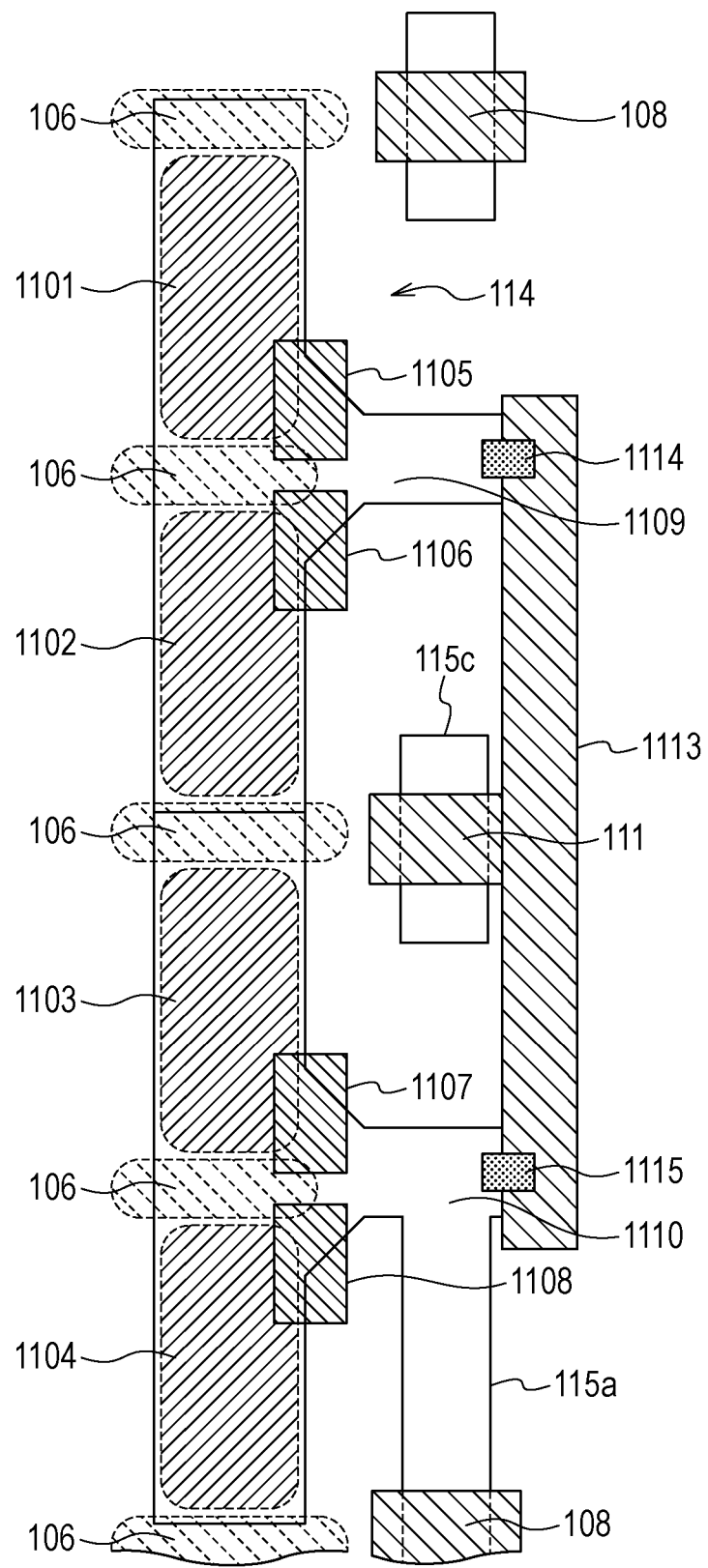
FIG. 11 is a schematic diagram of the planar structure of a solid-state image pickup device according to Example 5 of the invention.

Fifth Example according to the invention is described. FIG. 11 is a schematic diagram of the planar structure of this Example. Portions having the same function as in Example 1 are designated by the same reference numerals, and a detailed explanation thereof is omitted. The equivalent circuit of this Example is the same as that of Example 4.

FIG. 11 illustrates four photoelectric conversion portions. The first to fourth photoelectric conversion portions include N type semiconductor regions 1101 to 1104, respectively. Transfer gate electrodes 1105 to 1108 are disposed corresponding to the four N-type semiconductor regions 1101 to 1104, respectively. Electrons of the N-type semiconductor region 1101 contained in the first photoelectric conversion portion and the N-type semiconductor region 1102 contained in the second photoelectric conversion portion are transferred to a first FD 1109. Electrons of the N-type semiconductor region 1103 contained in the third photoelectric conversion portion and the N-type semiconductor region 1104 contained in the fourth photoelectric conversion portion are transferred to a second FD 1110. The first FD 1109, the second FD 1110, the gate electrode 111 of an amplification transistor are electrically connected to each other by a connection wiring 1113. A gate electrode 111 of the amplification transistor and the connection wiring 1113 are united. The first FD 1109 and the connection wiring 1113 are electrically connected by a shared contact 1114. The second FD 1110 and the connection wiring 1113 are electrically connected by a shared contact 1115. The shared contact refers to a contact which connects semiconductor regions, a semiconductor region and a gate electrode, or gate electrodes without a wiring layer. In FIG. 11, the second FD 1110 is a common region with the source or the drain of a reset transistor. Therefore, the reset transistor is disposed in the active region 115a where the photoelectric conversion portion and the FD are disposed.

In this Example, the first FD 1109 and the second FD 1110 are electrically connected by the connection wiring 1113. According to such a configuration, the four photoelectric conversion portions share one amplification transistor 207. Therefore, the area of the photoelectric conversion portions can be enlarged in addition to the effects of Examples 1 to 3.

In the Examples 1 to 5 above, the transfer of the charges from the N-type semiconductor region where the N-type semiconductor region is contained in the photoelectric conversion portion to the FD is described as an example. However, the configuration to which the invention can be applied is not limited to such a configuration. For example, the invention can be applied in a transfer portion in which charges are transferred from an N-type semiconductor region included in an accumulation region in which charges are accumulated to an FD. The invention can also be applied to a charge transfer portion of a CCD. The configurations of Examples 1 to 5 can be combined as appropriate for implementation.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-026351 filed Feb. 9, 2011, which is hereby incorporated by reference herein in its entirety.

What is claimed is:

1. A solid-state image pickup device, comprising:
   a semiconductor substrate containing a first active region;
   a first semiconductor region of a first conductive type;
   a second semiconductor region of a second conductive type;
   a third semiconductor region of the first conductive type;
   a floating diffusion region;
   a first transistor including a first transfer gate electrode and the floating diffusion region;
   a second transistor including a second transfer gate electrode and the floating diffusion region, and
   an insulator disposed between the first transfer gate and the semiconductor substrate,
   wherein the first, second and third semiconductor regions and the floating diffusion region are disposed in the first active region,
   wherein the second semiconductor region is disposed between the first semiconductor region and the third semiconductor region, and
   wherein a distance from an interface of the semiconductor substrate and the insulator to a position of an impurity concentration peak of a part of the first semiconductor region disposed to be overlapped with a part of the first transfer gate electrode is different from a distance from the interface to a position of an impurity concentration peak of the second semiconductor region.

2. The solid-state image pickup device according to claim 1,
   wherein a part of the third semiconductor region is disposed to be overlapped with a part of the second transfer gate electrode.

3. The solid-state image pickup device according to claim 2, wherein
   the distance from the interface to the position of the impurity concentration peak of the part of the third semiconductor region is different from the distance from the interface to the position of the impurity concentration peak of the second semiconductor region.

4. The solid-state image pickup device according to claim 1, wherein an area of the first semiconductor region projected onto a plane is larger than an area of the floating diffusion region projected onto a plane.

5. The solid-state image pickup device according to claim 1, wherein another part of the first transfer gate electrode is overlapped with a part of the second semiconductor region.

6. The solid-state image pickup device according to claim 1, further comprising:
   a fourth semiconductor region of the first conductive type disposed to be overlapped with the first semiconductor region, wherein
   a position of an impurity concentration peak of the fourth semiconductor region and the position of the impurity concentration peak of the second semiconductor region are different from each other in depth based on the interface.

7. The solid-state image pickup device according to claim 6, wherein the first semiconductor region and the fourth semiconductor region are formed with different impurities.

8. The solid-state image pickup device according to claim 1, further comprising:
   a fifth semiconductor region of the second conductive type disposed to be overlapped with the second semiconductor region, wherein
   a position of an impurity concentration peak of the fifth semiconductor region and the position of the impurity concentration peak of the first semiconductor region are different from each other in depth based on the interface.

9. The solid-state image pickup device according to claim 1, further comprising:
   a fourth semiconductor region of the first conductive type disposed to be overlapped with the first semiconductor region; and
   a fifth semiconductor region of the second conductive type disposed to be overlapped with the second semiconductor region, wherein
   positions of the impurity concentration peaks of the first semiconductor region, the second semiconductor region, the fourth semiconductor region, and the fifth semiconductor region are different from each other in depth based on the interface.

10. The solid-state image pickup device according to claim 1, further comprising:
    a sixth semiconductor region of the second conductive type, wherein
    the sixth semiconductor region is disposed to be overlapped with the first semiconductor region and the second semiconductor region and is disposed at a position closer to the interface than the first semiconductor region and the second semiconductor are.

11. The solid-state image pickup device according to claim 1, further comprising:
    a first photoelectric conversion portion and a second photoelectric conversion portion, wherein
    the first semiconductor region constitutes a part of the first photoelectric conversion portion and the third semiconductor region constitutes a part of the second photoelectric conversion portion.

12. The solid-state image pickup device according to claim 1, wherein the second semiconductor region is a potential barrier against charges of the first semiconductor region.

13. The solid-state image pickup device according to claim 1, wherein the second semiconductor region is an isolation region for electrically isolating the first semiconductor region from another element.

14. The solid-state image pickup device according to claim 1, wherein an arrangement direction of the first semiconductor region and the third semiconductor region is different from both a charge transfer direction from the first semiconductor region to the floating diffusion region and a charge transfer direction from the third semiconductor region to the floating diffusion region.

15. The solid-state image pickup device according to claim 1, further comprising:
    an amplification portion configured to output a signal in accordance with transferred charges in the floating diffusion region,
    wherein a semiconductor substrate containing a second active region, an insulator isolation portion being disposed between the first active region and the second active region, and
    wherein the amplification portion is disposed in the second active region.

16. The solid-state image pickup device according to claim 1,
    wherein a part of the first semiconductor region is disposed to be overlapped with a part of the first transfer gate electrode,
    wherein a part of the third semiconductor region is disposed to be overlapped with a part of the second transfer gate electrode, and wherein the second semiconductor region is disposed between the part of the first semiconductor region and the part of the third semiconductor region.

\* \* \* \* \*